United States Patent
Miyano et al.

(10) Patent No.: US 9,053,779 B2
(45) Date of Patent: Jun. 9, 2015

(54) SEMICONDUCTOR DEVICE

(71) Applicant: Micron Technology, Inc., Boise, ID (US)

(72) Inventors: Kazutaka Miyano, Tokyo (JP); Ryuji Takishita, Tokyo (JP); Takeshi Konno, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/169,442

(22) Filed: Jan. 31, 2014

(65) Prior Publication Data

US 2014/0232438 A1  Aug. 21, 2014

(30) Foreign Application Priority Data

Feb. 18, 2013 (JP) ................... 2013-028714

(51) Int. Cl.
| | | |
|---|---|---|
| H03B 19/00 | (2006.01) |
| G11C 7/22 | (2006.01) |
| H03L 7/081 | (2006.01) |
| G11C 7/10 | (2006.01) |
| G11C 11/406 | (2006.01) |
| G11C 11/4074 | (2006.01) |
| G11C 11/4096 | (2006.01) |

(52) U.S. Cl.
CPC .............. *G11C 7/222* (2013.01); *H03L 7/0814* (2013.01); *H03L 7/0816* (2013.01); *H03L 7/0818* (2013.01); *G11C 7/1039* (2013.01); *G11C 11/40611* (2013.01); *G11C 11/4074* (2013.01); *G11C 11/4096* (2013.01); *G11C 2207/2227* (2013.01)

(58) Field of Classification Search
USPC ........................................ 327/161, 231, 262
See application file for complete search history.

(56) References Cited

U.S. PATENT DOCUMENTS

| | | | | |
|---|---|---|---|---|
| 7,826,305 B2 * | 11/2010 | Fujisawa | ..................... | 365/233.1 |
| 2001/0054922 A1 * | 12/2001 | Ikeda | ............................. | 327/156 |
| 2007/0279111 A1 * | 12/2007 | Maeda et al. | ................. | 327/158 |
| 2009/0016146 A1 * | 1/2009 | Fujisawa | ..................... | 365/233.1 |
| 2011/0058443 A1 * | 3/2011 | Fujisawa | ..................... | 365/233.1 |

FOREIGN PATENT DOCUMENTS

JP  2001-326563 A  11/2001

* cited by examiner

*Primary Examiner* — Adam Houston
(74) *Attorney, Agent, or Firm* — Dorsey & Whitney LLP

(57) ABSTRACT

A semiconductor device includes a first input terminal configured to receive a first clock signal, first control terminals configured to receive first control signals respectively, an output terminal, first inverters each including an input node coupled to the first input terminal, a control node coupled to a corresponding one of the first control terminals and an output node coupled to the output terminal, each of the first inverters being configured to be controlled to output an inverted first clock signal to the output terminal in response to a corresponding one of the first control signals supplied to a corresponding one of the control nodes, and an additional first inverter including an input node coupled to the first input terminal and an output node coupled to the output terminal, the additional first inverter being free from any other control nodes to output an inverted first clock signal to the output terminal.

16 Claims, 11 Drawing Sheets

SEMICONDUCTOR DEVICE

This application is based upon and claims the benefit of priority from Japanese patent application No. 2013-28714, filed on Feb. 18, 2013, the disclosure of which is incorporated herein in its entirety by reference.

BACKGROUND OF THE INVENTION

1. Field of the Invention

The present invention relates to a semiconductor device, in particular, to a semiconductor device that generates a phase-adjusted output signal.

2. Description of Related Art

Synchronous memories, which operate in synchronization with a clock signal, have been widely used as memories for personal computers and so forth. DDR (Double Data Rate) type synchronous memories are provided with a DLL (Delay Locked Loop) circuit which generates an inner clock signal (for example, an input/output clock signal) that causes output data to synchronize with an external clock signal.

A DLL circuit has a counter circuit and a delay circuit. The counter circuit updates a count value on the basis of the difference between the phase of the external clock signal and the phase of the inner clock signal. The delay circuit delays the external clock signal on the basis of the count value of the counter circuit and thereby generates the inner clock signal.

As the delay circuit, a circuit that has a coarse adjustment section and a fine adjustment section is known. The coarse adjustment section delays the external clock signal at a relatively coarse pitch. The fine adjustment section delays the external clock signal at a relatively fine adjustment pitch.

For example, the coarse adjustment section has a delay line and a selection circuit. The delay line, which is composed of a plurality of delay elements that are connected in series, delays the external clock signal. The selection circuit selects two signals LCLKE and LCLKO from output signals of the plurality of delay elements on the basis of a delay control adjustment code, and outputs the two signals LCLKE and LCLKO to the fine adjustment section.

For example, the fine adjustment section adjusts the phase of input/output clock signal LCLK, which becomes an output signal, in the range from the phase of signal LCLKE to the phase of signal LCLKO on the basis of the delay amount adjustment code.

As the fine adjustment section, for example, a fine delay circuit that has a plurality of clocked inverters is known as disclosed in Patent Literature 1 that is JP2001-326563A (see FIG. 8).

The fine delay circuit that is described in FIG. 8 in Patent Literature 1 has a clocked inverter block (hereinafter referred to as "first clocked inverter circuit") in which clocked inverters that accept one of two input signals are connected in parallel; and another clocked inverter block (hereinafter referred to as "second clocked inverter circuit") in which clocked inverters that accept the other of the two input signals are connected in parallel.

In the fine delay circuit described in FIG. 8 in Patent Literature 1, all the clocked inverters in the second clocked inverter circuit accept addresses (delay amount adjustment control signals) that are used to set the delay amount of the fine delay circuit. All the clocked inverters in the second clocked inverter circuit are turned on or off on the basis of the addresses.

The inventors of the present invention have found out that in the fine adjustment section, under a situation in which all the clocked inverters (output ports) that accept one of two input signals are selectively turned on or off on the basis of the delay adjustment control signals, if all the clocked inverters are turned off, the phase adjustment accuracy of the fine adjustment section fluctuates. Next, this point will be described with reference to FIG. 1 to FIG. 4.

FIG. 1 is a schematic diagram showing an example of fine adjustment section 200 in which all clocked inverters are turned on or off based on adjustment code CODE (delay adjustment control signal).

In fine adjustment section 200, each of clocked inverters 201a to 201d that are connected in parallel, which compose clocked inverter circuit 201, accepts adjustment code CODE from its own control terminal. Each of clocked inverters 201a to 201d is turned on or off based on adjustment code CODE. Each of clocked inverters 201a to 201d outputs a signal based on signal LCLKE when being turned on.

On the other hand, each of clocked inverters 202a to 202d that are connected in parallel, which compose clocked inverter circuit 202, accepts adjustment code CODEB, which is generated by inverting adjustment code CODE, from its own control terminal through inverter circuit 203. Each of clocked inverters 202a to 202d is turned on or off based on adjustment code CODEB. Each of clocked inverters 202a to 202d outputs a signal based on signal LCLKO when turned on.

Synthesizing section 204 synthesizes signals that are output from clocked inverters 201a to 201d and signals that are output from clocked inverters 202a to 202d to generate input/output clock signal LCLK.

Numerals described in individual clocked inverters represent the ratios of gate widths of clocked inverters (hereinafter they may be referred to as "sizes"). In the example shown in FIG. 1, assuming that the sizes of clocked inverters 201a and 202a are 1, the sizes of clocked inverters 201b, 201c, and 201d (and clocked inverters 202b, 202c, and 202d) become 2, 4, and 8, respectively. In accordance with the size of a clocked inverter becoming larger, the drive capability of the clocked inverter becomes larger and the dynamic resistance of the clocked inverter becomes smaller.

FIG. 2 is a schematic diagram showing the relationship of signal LCLKE, signal LCLKO, adjustment code CODE, and input/output clock signal LCLK.

As shown in FIG. 2, the edge position of input/output clock signal LCLK moves between the edge position of signal LCLKE and the edge position of signal LCLKO on the basis of adjustment code CODE.

It is assumed that when all clocked inverters 201a to 201d on the signal LCLKE side are turned on (CODE=0000), synthesized size W of fine adjustment section 200 is W=15 and that when all clocked inverters 202a to 202d on the signal LCLKO side are turned on (CODE=1111), synthesized size W is W=−15. While adjustment code CODE is incremented by 1 from 0000 to 1111 and then decremented by 1, synthesized size W varies as 15, 13, 11, 9, 7, 5, 3, 1, −1, −3, −5, −7, −9, −11, −13, −15, −13, −11, . . . and so forth. In other words, if the change width of adjustment code CODE is 1, the change width of synthesized size W becomes 2 as a constant value.

However, as shown in FIG. 3, the inventors of the present invention have found out that when adjustment code CODE varies from "CODE=0000" (minimum code) to "CODE=0001" and when adjustment code CODE varies from "CODE=1111" (maximum code) to "CODE=1110," the phase (delay amount) of input/output clock signal LCLK, which is a real output signal of fine adjustment section 200, largely fluctuates. FIG. 3 is a schematic diagram showing the relationship between the phase step of input/output clock signal LCLK and adjustment code CODE.

A study that is conducted by the inventors of the present invention has revealed that such a large fluctuation may occur because the change of the current that can flow in one clocked inverter circuit, when the synthesized size of the one clocked inverter circuit is changed by a predetermined value in a situation in which the synthesized size is close to 0, is different from the change of the current that can flow in the clocked inverter circuit when the synthesized size is changed by the predetermined value in a situation in which the synthesized size is not close to 0.

FIG. 4 is a schematic diagram showing the relationship between the synthesized size of clocked inverter circuit 202 that accepts signal LCLKO and the current that flows in clocked inverter circuit 202.

In FIG. 4, increase D0 of the current, which flows from clocked inverter circuit 202 when the synthesized size of clocked inverter circuit 202 increases from "0" to "1", is different from increase D1 of the current that flows from clocked inverter circuit 202 when the synthesized size of clocked inverter circuit 202 increases from "1" to "2."

Increase D1 of the current that flows from clocked inverter circuit 202 when the synthesized size of clocked inverter circuit 202 increases from "1" to "2" is equal to increase D2 of the current that flows from clocked inverter circuit 202 when the synthesized size of clocked inverter circuit 202 increases from "2" to "3."

Thus, in the fine adjustment section, in a situation in which all clocked inverters (output ports) that accept one of two input signals are selectively turned on or off, if all the clocked inverters are turned off, it becomes difficult to accurately control the current that flows from the clocked inverters.

SUMMARY

In one embodiment, there is provided a semiconductor device that includes a first input terminal configured to receive a first clock signal, a plurality of first control terminals configured to receive first control signals respectively, an output terminal, a plurality of first inverters each including an input node coupled to the first input terminal, a control node coupled to a corresponding one of the first control terminals and an output node coupled to the output terminal, each of the first inverters being configured to be controlled to output an inverted first clock signal to the output terminal in response to a corresponding one of the first control signals supplied to a corresponding one of the control nodes, and an additional first inverter including an input node coupled to the first input terminal and an output node coupled to the output terminal, the additional first inverter being free from any other control nodes to output an inverted first clock signal to the output terminal.

In another embodiment, there is provided a semiconductor device that includes first and second input terminals configured to receive first and second clock signals respectively, a plurality of control terminals configured to receive control signals respectively, an output terminal, a first output circuit driving the first clock signal to the output terminal in response to a drive capability defined by the control signals, a second output circuit driving the second clock signal to the output terminal in response to a drive capability defined by the control signals, a third output circuit driving the first clock signal to the output terminal by a fixed drive capability, and a fourth output circuit driving the second clock signal to the output terminal by the fixed drive capability.

In another embodiment, there is provided a semiconductor device that includes first and second input terminals, a plurality of first control terminals, a plurality of second control terminals, an output terminal, a plurality of first clocked inverters each including a first input node coupled to the first input terminal, a first control node coupled to a corresponding one of the first control terminals and a first output node coupled to the output terminal, a plurality of second clocked inverters each including a second input node coupled to the second input terminal, a second control node coupled to a corresponding one of the second control terminals and a second output node coupled to the output terminal, a first inverter including a third input node coupled to the first input terminal and a third output node coupled to the output terminal, control nodes being not prepared in the first inverter, a second inverter including a fourth input node coupled to the second input terminal and a fourth output node coupled to the output terminal, control nodes being not prepared in the second inverter, and a plurality of third inverters each including a fifth input node coupled to a corresponding one of the first control terminals and a fifth output node coupled to a corresponding one of the second control terminals.

According to the one exemplary embodiment, the output nodes of the first clocked inverter circuits, the output nodes of the second clocked inverter circuits, the output node of the first inverter circuit, and the output node of the second inverter circuit are connected to the output terminal.

Thus, all the clocked inverter circuits and the inverter circuits, which accept either the first clock signal or the second clock signal, can be prevented from not outputting signals. As a result, the total amount of signals, which are output on the basis of the first clock signal, and the total amount of signals, which are output on the basis of the second clock signal, can be accurately controlled on the basis of the control signal. Consequently, the phases of signals can be accurately adjusted.

BRIEF DESCRIPTION OF THE DRAWINGS

The above features and advantages of the present invention will be more apparent from the following description of certain preferred embodiments taken in conjunction with the accompanying drawings in which.

DETAILED DESCRIPTION OF THE PREFERRED EMBODIMENTS

The invention will now be described herein with reference to illustrative embodiments. Those skilled in the art will recognize that many alternative embodiments can be realized using the teachings of the present invention and that the invention is not limited to the embodiments illustrated for explanatory purposes.

Next, with reference to the accompanying drawings, embodiments of the present invention will be described.

Figure 5:
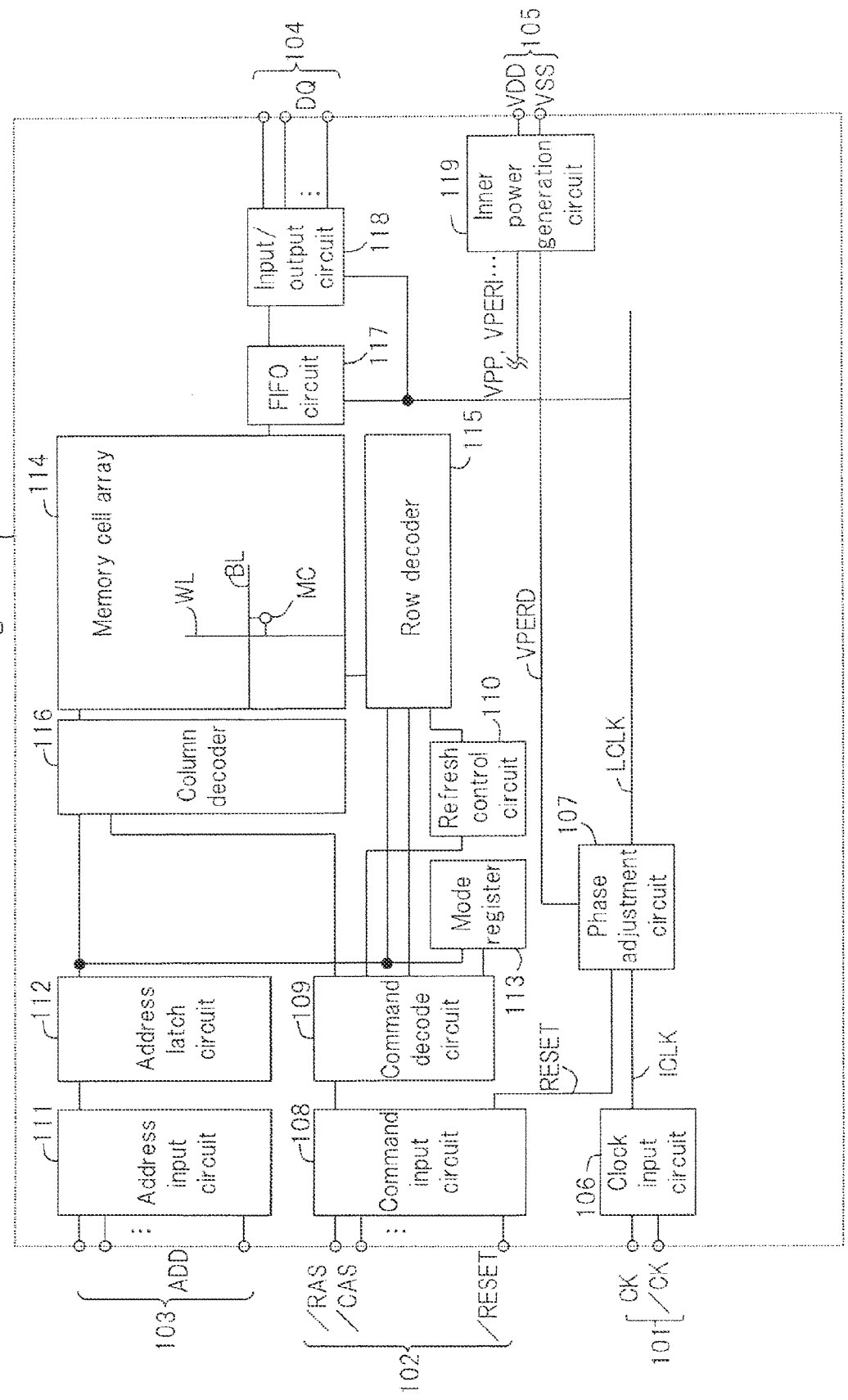
FIG. 5 is a schematic diagram showing semiconductor device 100 according to a first embodiment of the present invention.

FIG. 5 is a schematic diagram showing semiconductor device 100 according to a first embodiment of the present invention. According to this embodiment, as semiconductor device 100, a RAM (Random Access Memory) is used.

Semiconductor device 100 includes external terminals that includes clock terminal block 101, command terminal block 102, address terminal block 103, data input/output terminal block 104, and power supply terminal block 105.

In addition, semiconductor device 100 includes clock input circuit 106, phase adjustment circuit 107, command input circuit 108, command decode circuit 109, refresh control circuit 110, address input circuit 111, address latch circuit 112, mode register 113, memory cell array 114, row decoder 115, column decoder 116, FIFO (First-In First-Out) circuit 117, input/output circuit 118, and inner power generation circuit 119.

Clock terminal block 101 accepts external clock signals CK and /CK.

In this specification, a signal, whose name includes "/" at the front position, represents an inverted signal or a low active signal of the relevant signal. Thus, external clock signals CK and /CK are signals that compliment each other.

Clock input circuit 106 accepts external clock signals CK and /CK from clock terminal block 101 and generates inner clock signal ICLK in synchronization with external clock signals CK and /CK by using external clock signals CK and /CK. Clock input circuit 106 outputs inner clock signal ICLK to phase adjustment circuit 107.

Phase adjustment circuit 107 is, for example, a DLL circuit. Phase adjustment circuit 107 adjusts the phase of inner clock signal ICLK to generate input/output clock signal LCLK. Phase adjustment circuit 107 executes a phase adjustment operation that sets the difference between the phase of inner clock signal ICLK and the phase of input/output clock signal LCLK to a predetermined value. Inner clock signal ICLK is an example of a phase adjustable signal. Input/output clock signal LCLK is an example of an output signal.

This embodiment features phase adjustment circuit 107 as will be described later.

Input/output clock signal LCLK that is generated by phase adjustment circuit 107 is supplied to FIFO circuit 117 and input/output circuit 118. FIFO circuit 117 and input/output circuit 118 will be described later.

Command terminal block 102 accepts command signals. For example, the command signals include row address strobe signals /RAS, column address strobe signal /CAS, and reset signal /RESET.

Command input circuit 108 accepts command signals from command terminal block 102 and outputs the command signals to command decode circuit 109. In addition, command input circuit 108 outputs reset signal RESET to phase adjustment circuit 107.

Command decode circuit 109 accepts command signals. Command decode circuit 109 holds, decodes, and counts the command signals and thereby generates inner command signals. Command decode circuit 109 generates inner command signals such as refresh command, write command, and read command.

Refresh control circuit 110 accepts a refresh command from command decode circuit 109. When refresh control circuit 110 accepts the refresh command, refresh control circuit 110 supplies a refresh signal to row decoder 115.

Address terminal block 103 accepts an address signal.

Address input circuit 111 accepts an address signal from address terminal block 103 and outputs the address signal to address latch circuit 112.

Address latch circuit 112 accepts the address signal from address input circuit 111. When address latch circuit 112 sets mode register 113, address latch circuit 112 outputs the address signal to mode register 113. In addition, address latch circuit 112 outputs a row address in the address signal to row decoder 115 and a column address in the address signal to column decoder 116.

Mode register 113 is a register to which an operation parameter (for example, burst length or CAS latency) of semiconductor device 100 is set. Mode register 113 accepts an inner command signal from command decode circuit 109, and the address signal from address latch circuit 112, and sets an operation parameter that is specified on the basis of the inner command signal and the address signal.

Memory cell array 114 includes a plurality of word lines WL, a plurality of bit lines BL, and a plurality of memory cells MC. Each memory cell MC is specified on the basis of word line WL and bit line BL.

Row decoder 115 accepts the row address from address latch circuit 112 and accepts the write command or read command from command decode circuit 109. In addition, row decoder 115 accepts the refresh signal from refresh control circuit 110.

When row decoder 115 accepts the write command or read command, row decoder 115 selects word line WL, which corresponds to the row address, from among the plurality of word lines WL in memory cell array 114.

In memory cell array 114, the plurality of word lines WL intersect the plurality of bit lines BL. Memory cells MC are located at the intersections of the plurality of word lines WL and the plurality of bit lines BL. In FIG. 5, for simplicity, one word line WL, one bit line BL, and one memory cell MC are shown. Each of bit lines BL is connected to the corresponding sense amplifier (not shown).

When row decoder 115 accepts the refresh signal, row decoder 115 selects word line WL, which corresponds to the row address, from among the plurality of word lines WL, and then carries out a self refresh process that refreshes memory cell MC that corresponds to the selected word line WL.

Column decoder 116 accepts the column address from address latch circuit 112, and accepts the write command or read command from command decode circuit 109.

When column decoder 116 accepts the column address and either the write command or read command, column decoder 116 selects a sense amplifier, which corresponds to the column address, from among the plurality of sensor amplifiers.

When data are read (when the read command occurs), each of pieces of data in the plurality of memory cells MC selected by word line WC is amplified by the plurality of sense amplifiers respectively. A plurality of pieces of data, which are amplified by sense amplifiers that are selected by column decoder 116, are output from data input/output terminal block 104 through FIFO circuit 117 and input/output circuit 118. In contrast, when data are written (when the write command occurs), a plurality of pieces of data that are accepted by data input/output terminal block 104 are written, through input/output circuit 118 and FIFO circuit 117 and through the plurality of sense amplifiers that are selected by column decoder 116, to the plurality of memory cells MC that corresponds to the plurality of sense amplifiers that are selected by column decoder 116.

FIFO circuit 117 accepts input/output clock signal LCLK from phase adjustment circuit 107, and exchanges "data that are read" and "data that are to be written" between memory cell array 114 and input/output circuit 118 in synchronization with input/output clock signal LCLK. In particular, when data are read, FIFO circuit 117 converts the plurality of pieces of data that have been read in parallel into serial data. In contrast, when data are written, FIFO circuit 117 converts serial data into parallel data.

Data input/output terminal block 104 outputs data that are read, and accepts data that are to be written. Data input/output terminal block 104 is connected to input/output circuit 118.

Input/output circuit 118 accepts input/output clock signal LCLK from phase adjustment circuit 107. When data are read, input/output circuit 118 outputs the data that are read to data input/output terminal block 104 in synchronization with input/output clock signal LCLK.

Power supply terminal block 105 accepts high power supply voltage VDD and low power supply voltage VSS.

Inner power generation circuit 119 accepts voltage VDD and voltage VSS from power supply terminal block 105 to generate inner power supply voltages such as voltage VPP, voltage VPERI, and voltage VPERD.

Next, phase adjustment circuit 107 will be described.

Figure 6:
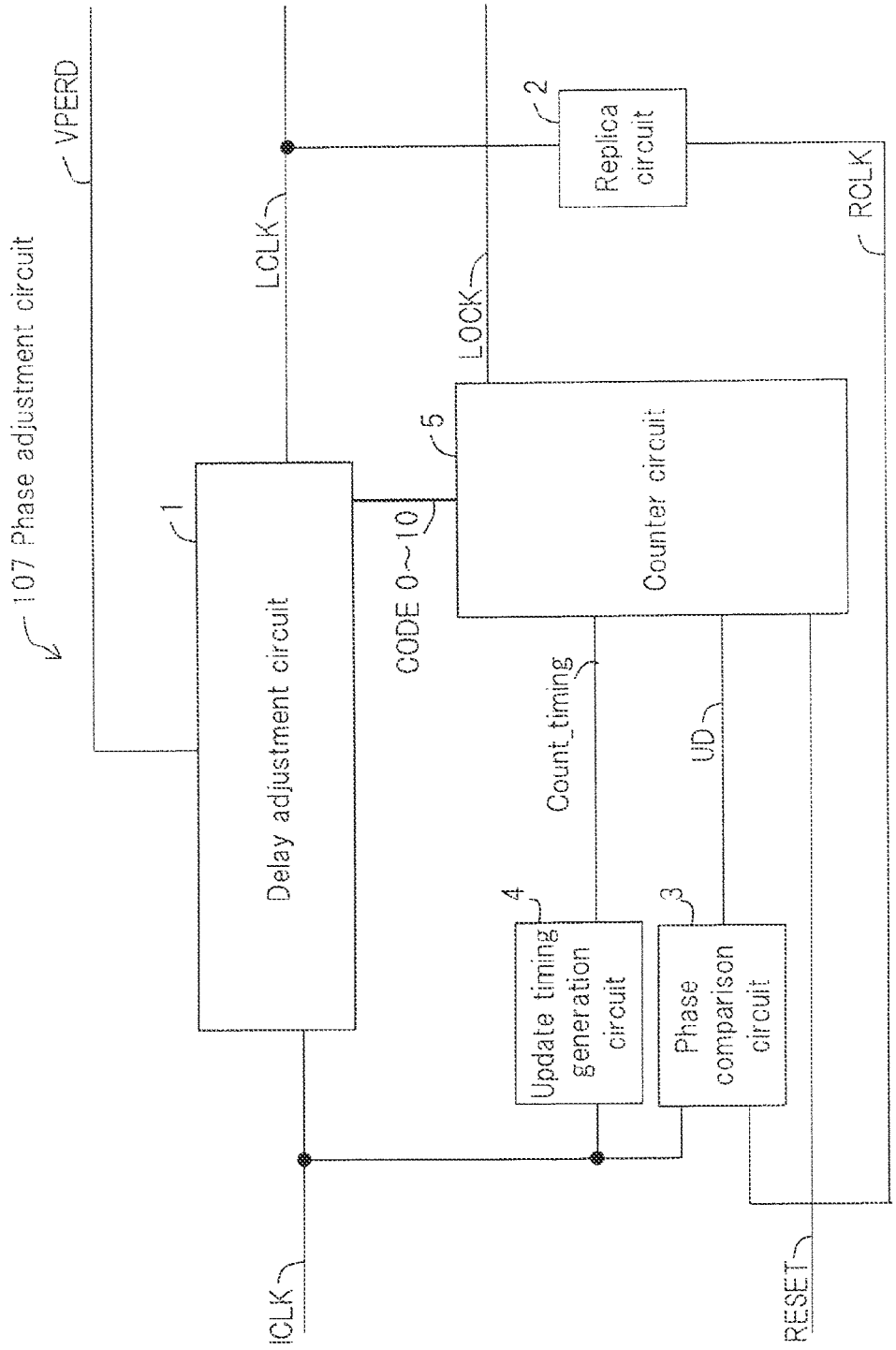
FIG. 6 is a schematic diagram showing phase adjustment circuit 107.

FIG. 6 is a schematic diagram showing phase adjustment circuit 107. In FIG. 6, phase adjustment circuit 107 includes delay adjustment circuit 1, replica circuit 2, phase comparison circuit 3, update timing generation circuit 4, and counter circuit 5.

Delay adjustment circuit 1 is an example of a delay adjustment device according to an embodiment of the present invention.

Delay adjustment circuit 1 delays inner clock signal ICLK to generate input/output clock signal LCLK. Voltage VPERD is supplied to delay adjustment circuit 1.

Features of delay adjustment circuit 1 will be described later.

Input/output clock signal LCLK is supplied to FIFO circuit 117, input/output circuit 118 (they are shown in FIG. 5), and replica circuit 2.

Replica circuit 2 is a circuit that causes a delay that is equivalent to a delay that occurs in a real signal route from delay adjustment circuit 1 to data input/output terminal block 104 (this signal route is simply referred to as "signal route"). The delay that occurs in the signal route is mainly caused by an output buffer included in input/output circuit 118.

Replica circuit 2 outputs replica clock signal RCLK that is later than input/output clock signal LCLK by the amount of delay that occurs in the signal route. Thus, the phase of replica clock signal RCLK substantially matches the phase of the signal that is output from data input/output terminal block 104.

Phase comparison circuit 3 detects the difference between the phase of inner clock signal ICLK and the phase of replica clock signal RCLK.

As described above, delay adjustment circuit 1 adjusts the phase of replica clock signal RCLK such that the phase of replica clock signal RCLK substantially matches the phase of the output signal of data input/output terminal block 104. However, since parameters such as voltage and temperature affect the delay that occurs in delay adjustment circuit 1, when they fluctuate, the phases of replica clock signal RCLK and the output signal of data input/output terminal block 104 vary over time.

Phase comparison circuit 3 detects these variations, and determines whether or not the phase of replica clock signal RCLK is earlier than the phase of inner clock signal ICLK, for example, every period of inner clock signal ICLK.

Phase comparison circuit 3 outputs the determined result as phase determination signal UD to counter circuit 5. If the phase of replica clock signal RCLK is earlier than the phase of inner clock signal ICLK, the signal level of phase determination signal UD becomes "H." In contrast, if the phase of replica clock signal RCLK is later than the phase of inner clock signal ICLK, the signal level of phase determination signal UD becomes "L."

Update timing generation circuit 4 divides the frequency of inner clock signal ICLK so as to generate count timing signal Count_timing that is a one-shot pulse. Count timing signal Count_timing is output to counter circuit 5. Counter circuit 5 uses count timing signal Count_timing as a synchronization signal that represents timings at which the count value of counter circuit 5 is updated. Thus, the period at which the signal level of count timing signal Count_timing becomes high is defined as a sampling period of phase adjustment circuit 107.

Counter circuit 5 generates adjustment code CODE that is to be used to set the delay that occurs in delay adjustment circuit 1. According to this embodiment, adjustment code CODE is information composed of 11 bits (0-th to 10-th bits). Adjustment code CODE is not limited to information composed of 11 bits, but can be adequately changed.

Counter circuit 5 updates its count value in synchronization with count timing signal Count_timing. The count value is incremented or decremented based on phase determination signal UD that is supplied from phase comparison circuit 3.

According to this embodiment, if the signal level of phase determination signal UD is "H," counter circuit 5 counts up the count value in synchronization with count timing signal Count_timing. As a result, the delay that occurs in delay adjustment circuit 1 is increased. In contrast, if the signal level of phase determination signal UD is "L," counter circuit 5 counts down the count value in synchronization with count timing signal Count_timing. As a result, the delay that occurs in delay adjustment circuit 1 is decreased.

When counter circuit 5 alternately repeats down-counts and up-counts a predetermined number of times (for example, twice), counter circuit 5 determines that the phase of inner clock signal ICLK matches the phase of replica clock signal RCLK, and then generates adjustment code CODE based on the count value, and holds adjustment code CODE, and outputs lock signal LOCK that is activated lock signal LOCK that is activated is supplied to a phase adjustment control circuit (not shown) that controls operation timings of phase adjustment circuit 107 so as to control the operation of the phase adjustment control circuit.

In addition, reset signal RESET is supplied to counter circuit 5. When the signal level of reset signal RESET becomes activated, counter circuit 5 initializes the count value to set the preset value.

Next, delay adjustment circuit 1 will be described.

Figure 7:
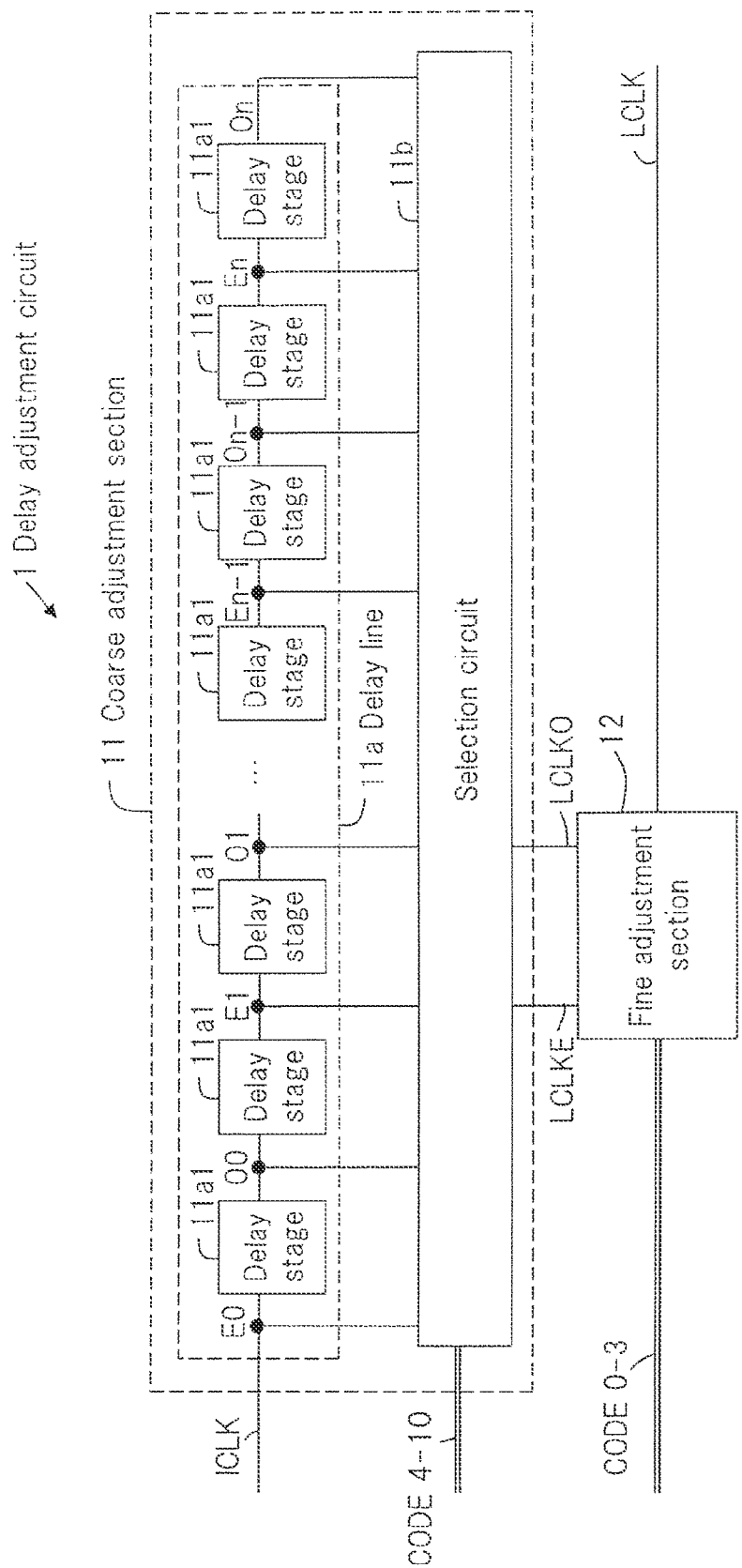
FIG. 7 is a schematic diagram showing delay adjustment circuit 1.

FIG. 7 is a schematic diagram showing delay adjustment circuit 1. In FIG. 7, delay adjustment circuit 1 includes coarse adjustment section 11 and fine adjustment section 12.

Coarse adjustment section 11 delays inner clock signal ICLK at a relatively coarse adjustment pitch. Coarse adjustment section 11 includes delay line 11a and selection circuit 11b. Delay line 11a includes a plurality of delay stages 11a1, which are connected in series, and a plurality of taps E0 to En and O0 to On located between adjacent delay stages 11a1, at the input side of the first delay stage, and at the output side of the last delay stage. Delay line 11a is an example of a delay element, whereas selection circuit 11b is an example of a selection section. In addition, taps E0 to En and taps O0 to On are alternately located.

In delay line 11a, the plurality of delay stages 11a1 successively delay inner clock signal ICLK. Inner clock signal ICLK is an example of a third clock signal.

Selection circuit 11b selects, on the basis of information of fourth to tenth bits of adjustment code CODE, one of the even phase signals, which are output from taps E0 to En, and one of the odd phase signals which are output from taps O0 to On.

Selection circuit 11b outputs the selected one even phase signal as signal LCLKE to fine adjustment section 12 and outputs the selected one odd phase signal as signal LCLKO to fine adjustment section 12.

Fine adjustment section 12 is an example of an output signal generation device according to an embodiment of the present invention.

Fine adjustment section 12 accepts signal LCLKE and signal LCLKO and generates input/output clock signal LCLK that has a phase in the range between the phase of signal LCLKE and the phase of signal LCLKO. Signal LCLKE is an example of a first clock signal. Signal LCLKO is an example of a second clock signal. Next, features of fine adjustment section 12 will be described.

Figure 8:
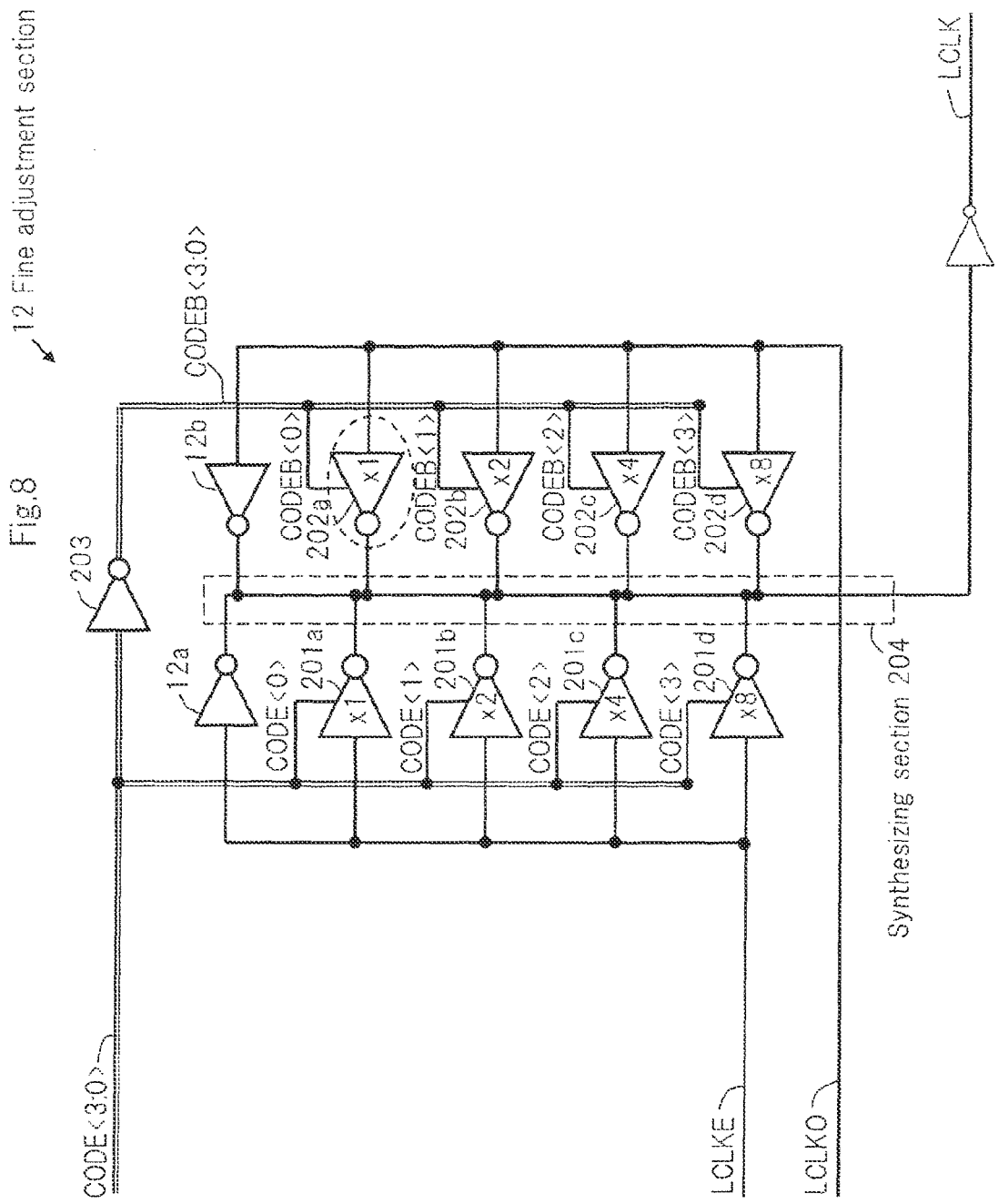
FIG. 8 is a schematic diagram showing fine adjustment section 12.

FIG. 8 is a schematic diagram showing fine adjustment section 12. In FIG. 8, similar structural sections to those shown in FIG. 1 are denoted by similar reference numerals.

Figure 1:
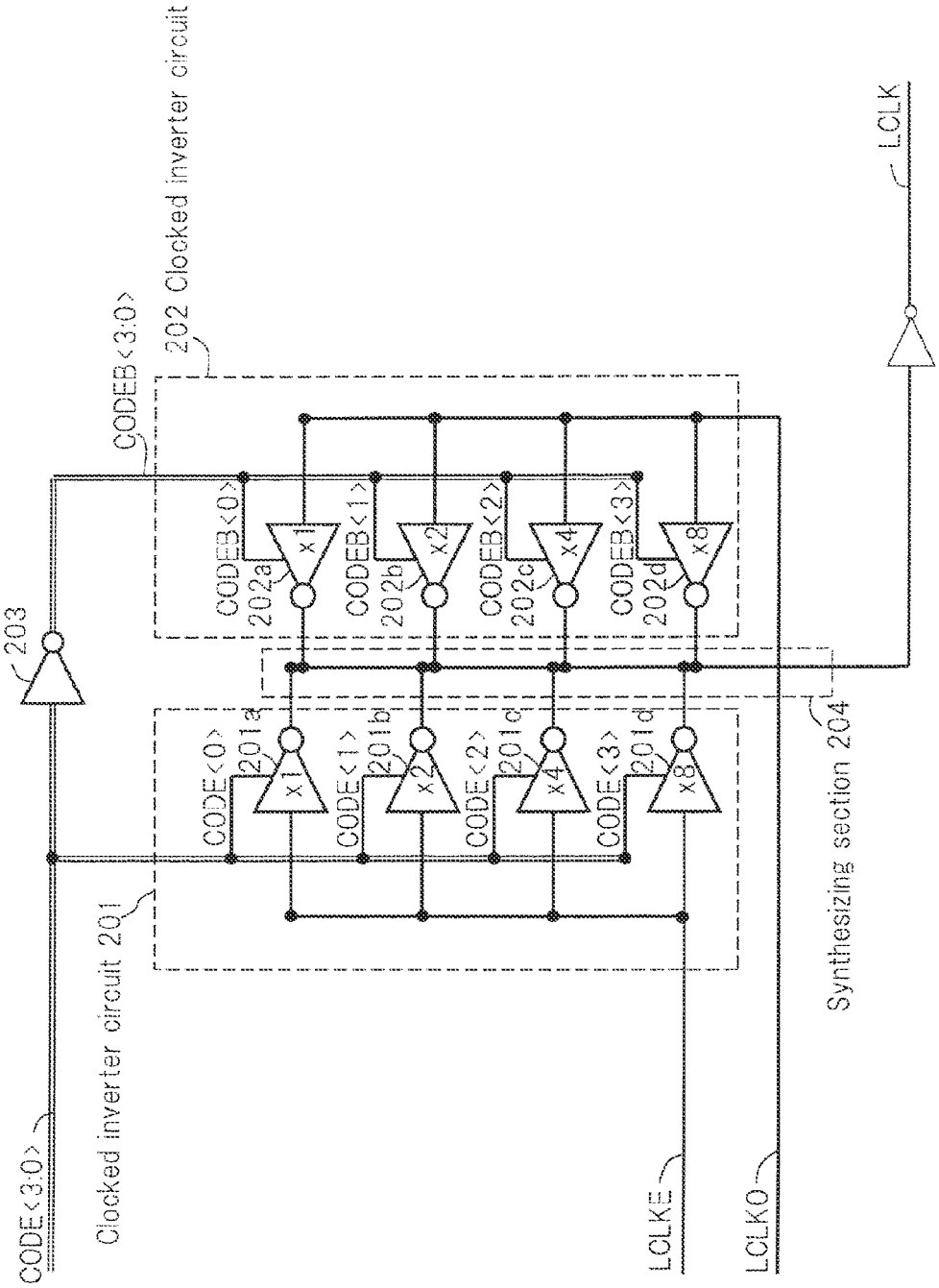
FIG. 1 is a schematic diagram showing an example of fine adjustment section 200 in which all clocked inverters are turned on or off on the basis of adjustment code CODE.
Figure 2:
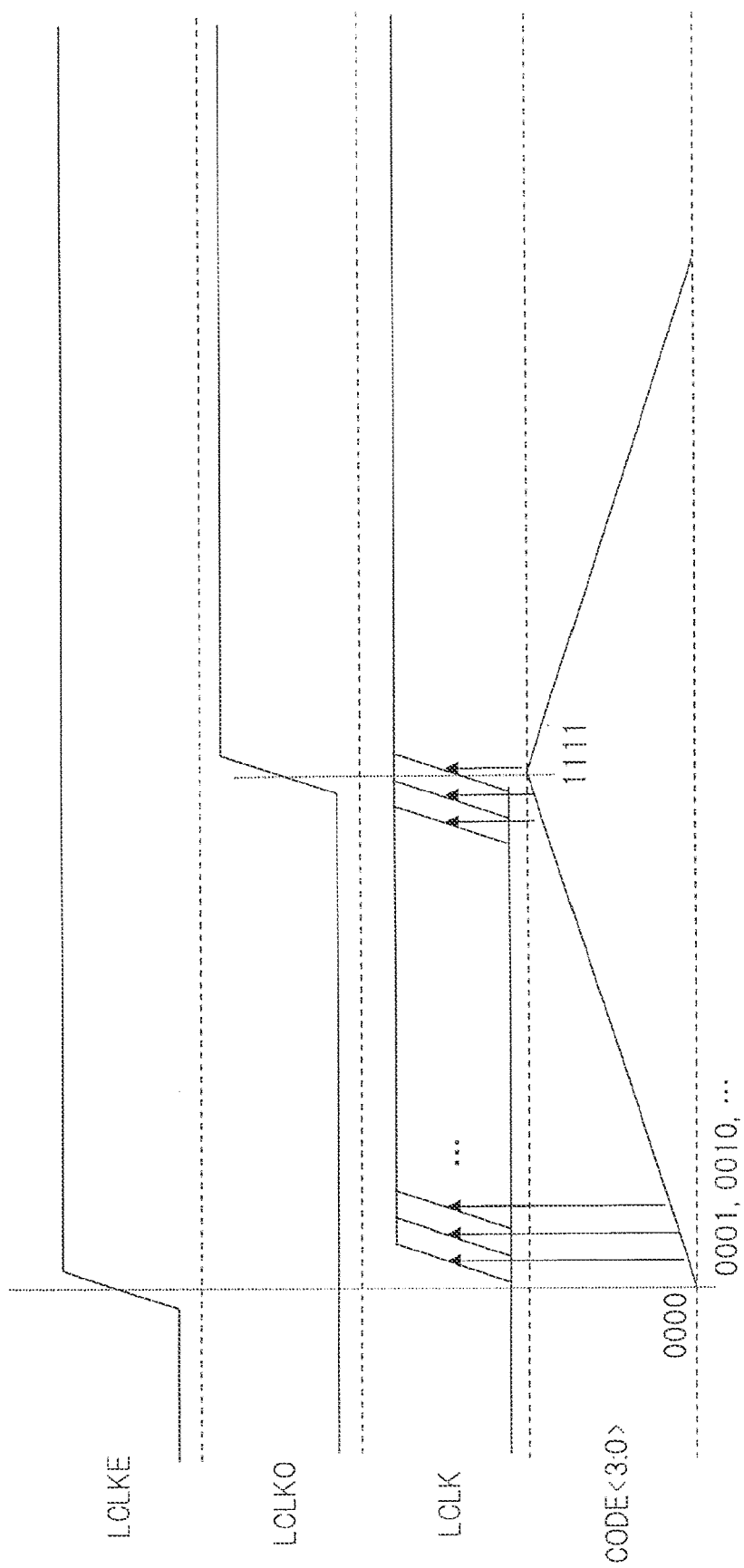
FIG. 2 is a schematic diagram showing the relationship between signal LCLKE, signal LCLKO, adjustment code CODE, and input/output clock signal LCLK.

Fine adjustment section 12 according to this embodiment is different from fine adjustment section 200 shown in FIG. 1 in that inverter circuits 12a and 12b are added and in that synthesizing section 204 synthesizes signals that are output from clocked inverters 201a to 201d, signals that are output from clocked inverters 202a to 202d, and signals that are output from inverter circuits 12a and 12b to generate input/output clock signal LCLK.

Clocked inverters 201a to 201d are an example of a first output circuit or an example of first clocked inverters. Clocked inverters 202a to 202d are an example of a second output circuit or an example of second clocked inverters. Inverter circuit 12a is an example of a third output circuit or an example of an additional first inverter. Inverter circuit 12b is an example of a fourth output circuit or an example of an additional second inverter.

Inverter circuit 12a is connected in parallel to clocked inverters 201a to 201d that accept signal LCLKE and outputs a signal to synthesizing section 204 in response to signal LCLKE.

Thus, even if all clocked inverters 201a to 201d are turned off on the basis of adjustment code CODE, current, which is based on signal LCLKE, is output from inverter circuit 12a to synthesizing section 204.

On the other hand, inverter circuit 12b is connected in parallel to clocked inverters 202a to 202d that accept signal LCLKO and outputs a signal in response to signal LCLKO.

Thus, even if all clocked inverters 202a to 202d are turned off on the basis of adjustment code CODE, current, which is based on signal LCLKO, is output from inverter circuit 12b to synthesizing section 204.

Figure 9:
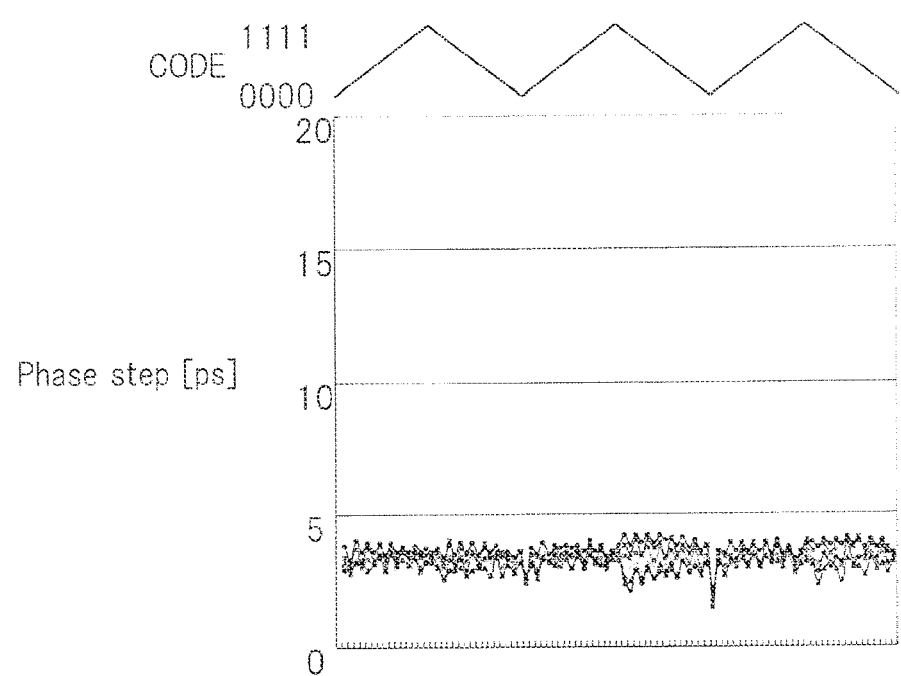
FIG. 9 is a schematic diagram showing the relationship between the phase step of input/output clock signal LCLK and adjustment code CODE in fine adjustment section 12.

FIG. 9 is a schematic diagram showing the relationship between the phase step of input/output clock signal LCLK and adjustment code CODE in fine adjustment section 12.

Figure 3:
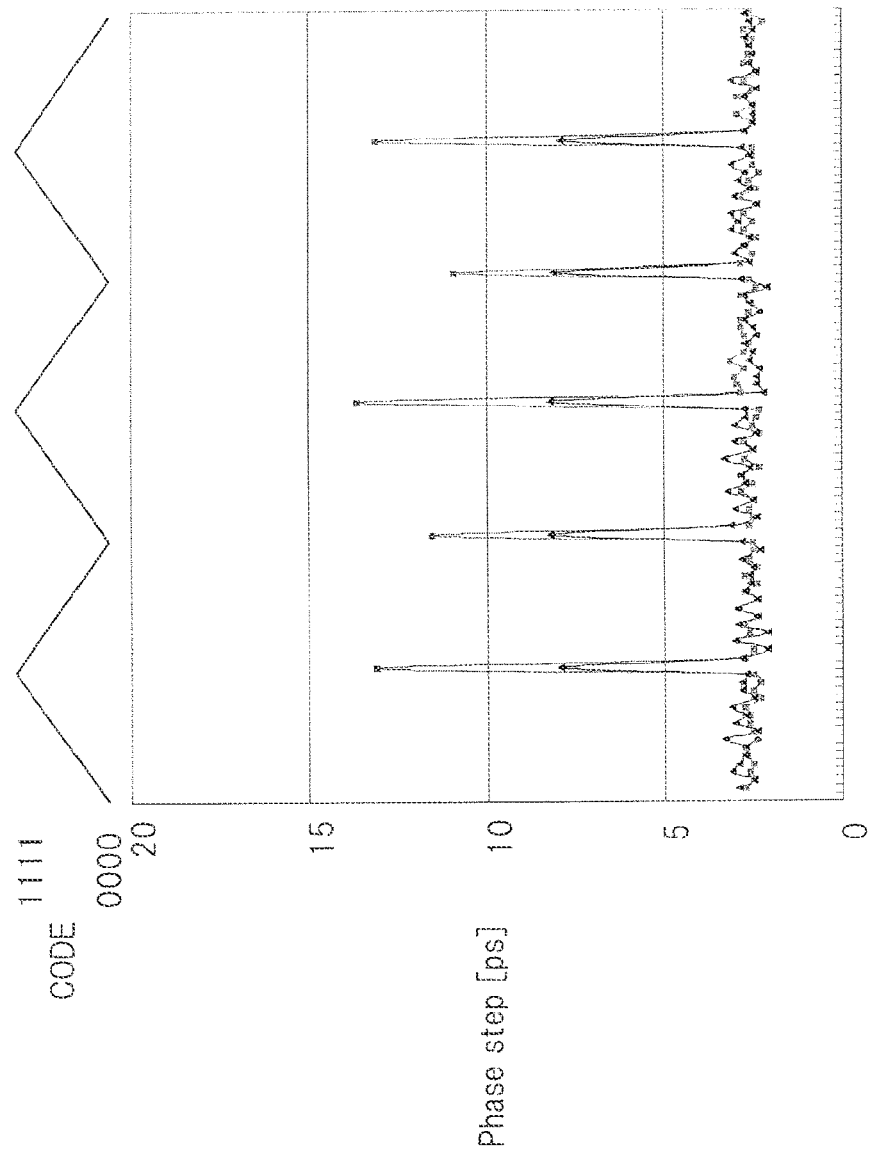
FIG. 3 is a schematic diagram showing the relationship between the phase step of input/output clock signal LCLK and adjustment code CODE.

As shown in FIG. 9, fine adjustment section 12 reduces large fluctuations of the phase (delay) of input/output clock signal LCLK compared with the related art reference shown in FIG. 3.

Figure 10:
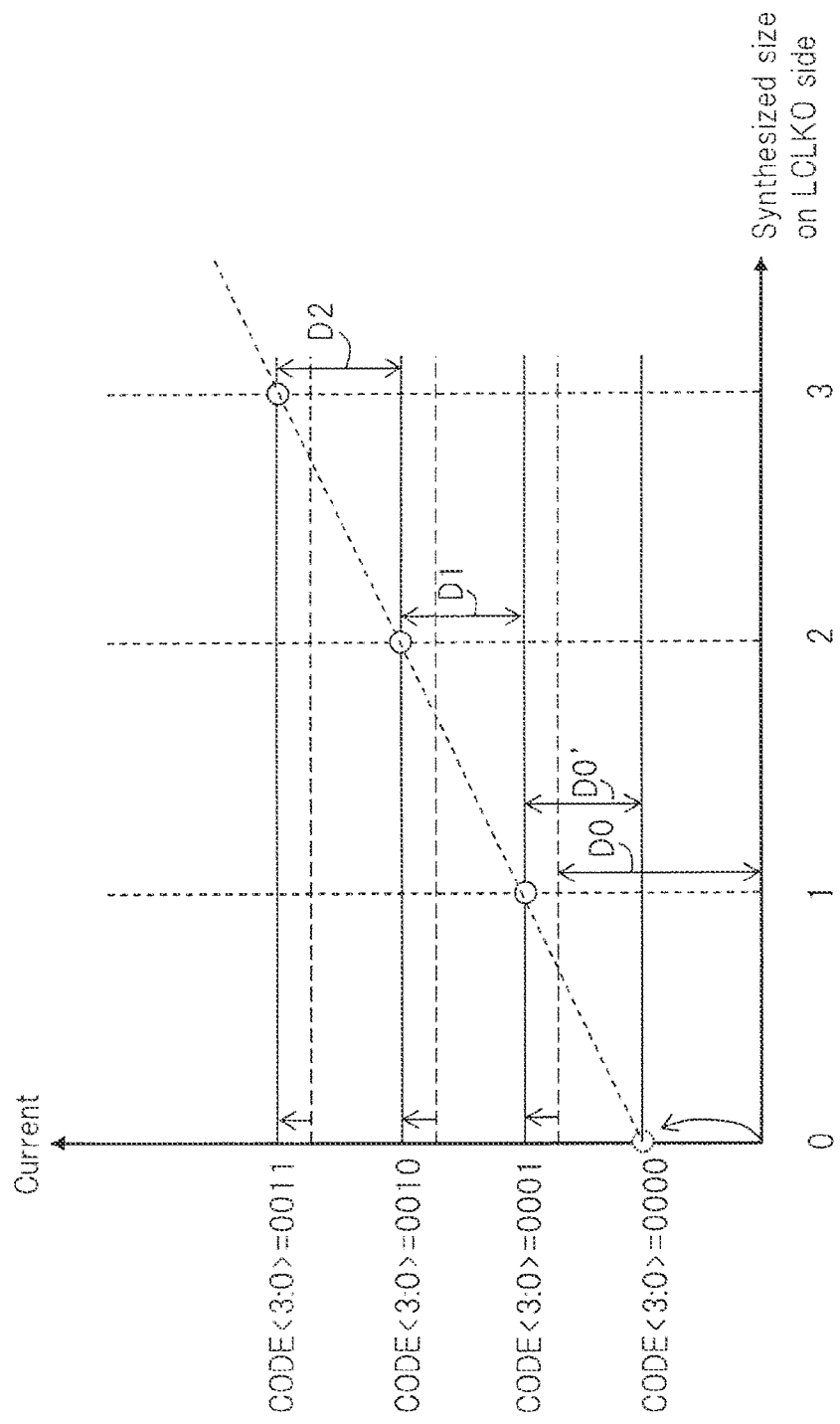
FIG. 10 is a schematic diagram showing the relationship between the synthesized size of clocked inverters 202a to 202d and the currents that flow in clocked inverters 202a to 202d and inverter circuit 12b in fine adjustment section 12.

FIG. 10 is a schematic diagram showing the relationship between the synthesized size of clocked inverters 202a to 202d included in fine adjustment section 12 and the current which flow in clocked inverters 202a to 202d included in fine adjustment section 12 and the current that flows in inverter circuit 12b.

Figure 4:
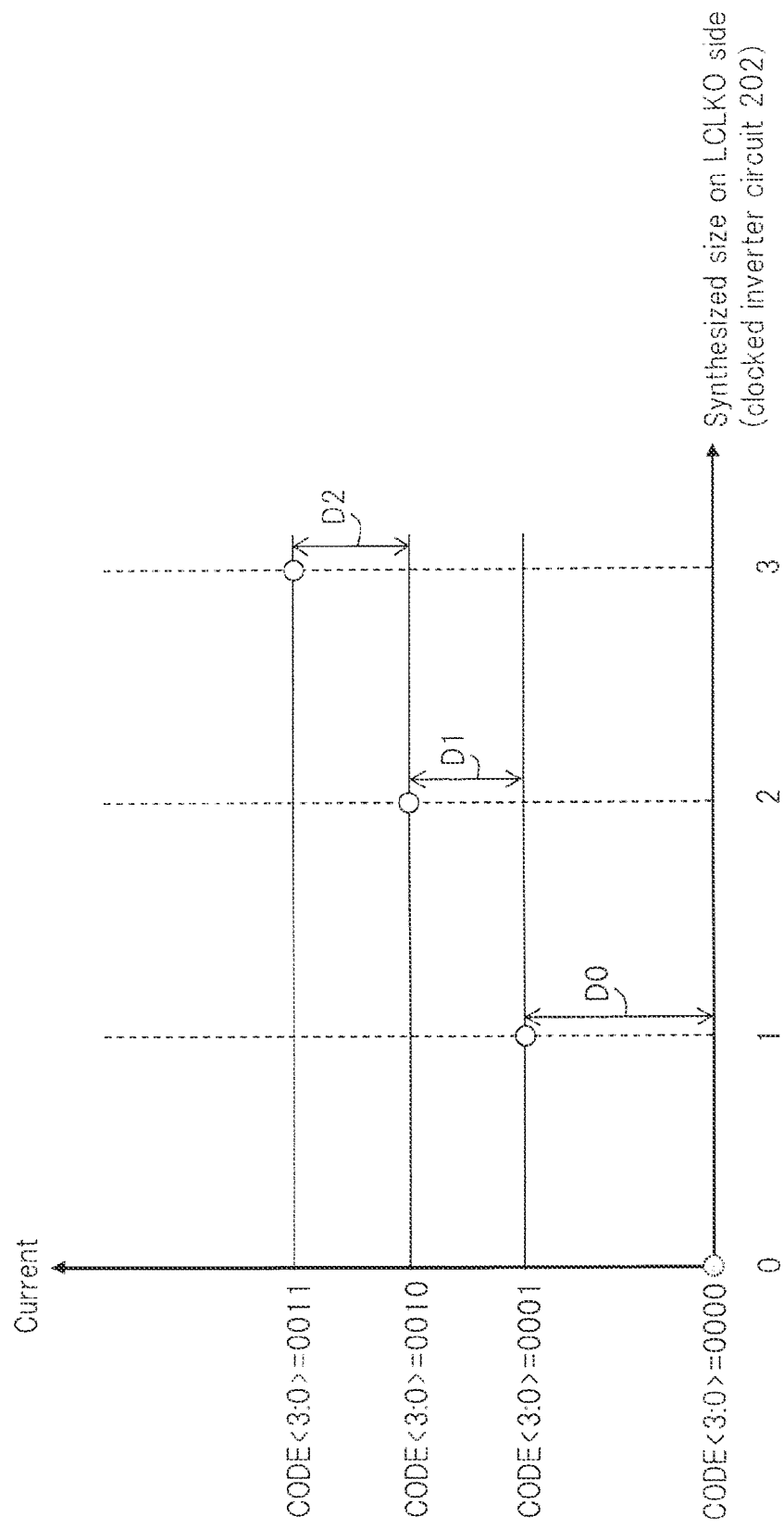
FIG. 4 is a schematic diagram showing the relationship between the synthesized size of clocked inverter circuit 202 that accepts signal LCLKO and the current that flows in clocked inverter circuit 202.

As shown in FIG. 10, inverter circuit 12b allows the current, which is output to synthesizing section 204 in accordance with signal LCLKO, to increase compared with the related art reference shown in FIG. 4.

Thus, when the synthesized size varies with changes in the predetermined width, the change widths of the currents match (D0'=D1=D2 in FIG. 10). Consequently, the currents (signals) that are output from the clocked inverters can be controlled with high accuracy. As a result, fine adjustment section 12 can adjust the phases with high accuracy.

It is preferable that the dynamic resistance of inverter circuit 12a be equal to or greater than the maximum value of the dynamic resistances of clocked inverters 201a to 201d so as to reduce current consumption in inverter circuit 12a. For example, it is preferable that the gate width (size) of inverter circuit 12a be equal to or smaller than the gate width (size) of clocked inverter 201a. Likewise, it is preferable that the gate width (size) of inverter circuit 12b be equal to or smaller than the gate width (size) of clocked inverter 202a.

Figure 11:
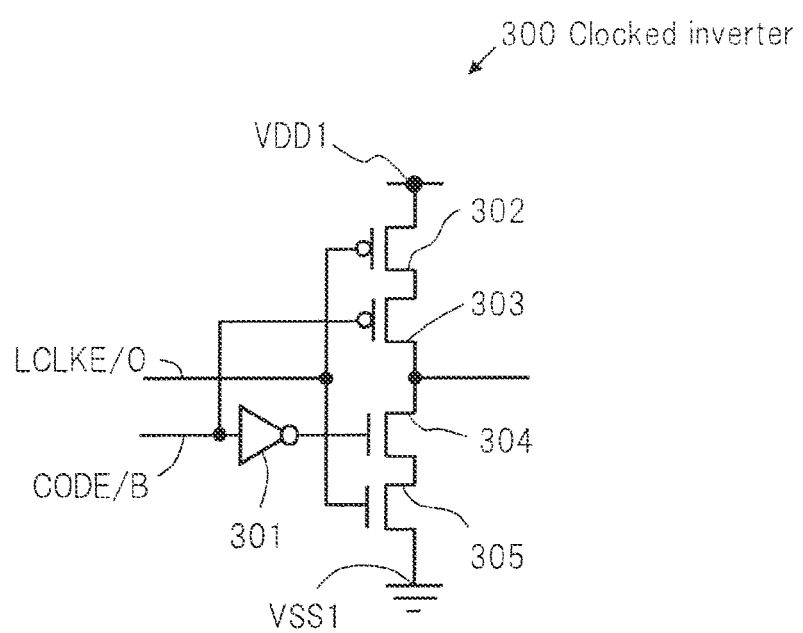
FIG. 11 is a schematic diagram showing an example of a clocked inverter used in fine adjustment section 12.

FIG. 11 is a schematic diagram showing an example of a clocked inverter used in fine adjustment section 12.

In FIG. 11, clocked inverter 300 includes inverter circuit 301, PMOS transistor 302, PMOS transistor 303, NMOS transistor 304, and NMOS transistor 305.

The PMOS transistor is an example of a first conduction type transistor. The NMOS transistor is an example of a second conduction type transistor. Each gate of the PMOS transistor and the NMOS transistor is an example of a control terminal.

PMOS transistors 302 and 303 and NMOS transistors 304 and 305 are successively connected in series between voltage terminals VDD1 and VSS1.

When clocked inverter 300 is used as a clocked inverter that accepts signal LCLKE, adjustment code CODE is input to the gate of inverter circuit 301 and the gate of PMOS transistor 303. In addition, signal LCLKE is input to the gate of PMOS transistor 302 and the gate of NMOS transistor 305. The output of inverter circuit 301 is input to the gate of NMOS transistor 304. A signal, which corresponds to signal LCLKE, is output from the connected point of the drain of PMOS transistor 303 and the drain of NMOS transistor 304.

In contrast, when clocked inverter 300 is used as a clocked inverter that accepts signal LCLKO, adjustment code CODEB is input to the gate of inverter circuit 301 and the gate of PMOS transistor 303. Signal LCLKO is input to the gate of PMOS transistor 302 and the gate of NMOS transistor 305. The output of inverter circuit 301 is input to the gate of NMOS transistor 304. A signal, which corresponds to signal LCLKO, is output from the connected point of the drain of PMOS transistor 303 and the drain of NMOS transistor 304.

PMOS transistor 302, PMOS transistor 303, NMOS transistor 304, and NMOS transistor 305 are examples of a first first-conduction-type transistor, a second first-conduction-type transistor, a first second-conduction-type transistor, and a second second-conduction-type transistor, respectively.

In clocked inverter 300, two transistors (PMOS transistor 302 and NMOS transistor 305) that accept signal LCLKE or LCLKO are connected to the outside of transistors that accept adjustment code CODE or CODEB (PMOS transistor 303 and NMOS transistor 304). Alternatively, the former may be connected to the inside of the latter. In this case, for the transistors that operate on the basis of signal LCLKE or LCLKO, transistors that accept adjustment code CODE or CODEB function as resistors and thereby they are expected to relatively decrease jitter.

In a case, when adjustment code CODE is 0000, all clocked inverters 201a to 201d are turned off and all clocked inverters 202a to 202d are turned on, and when adjustment code CODE is 1111, all clocked inverters 201a to 201d are turned on and all clocked inverters 202a to 202d are turned off, inverter circuit 301 may be located on the upstream side of the gate of PMOS transistor 303 instead of the upstream side of the gate of NMOS transistor 304.

The number of clocked inverters connected in parallel in fine adjustment section 12 is not limited to four, but can be adequately changed.

It is apparent that the present invention is not limited to the above embodiments, but may be modified and changed without departing from the scope and spirit of the invention.

What is claimed is:

1. A semiconductor device comprising:
   a first input terminal configured to receive a first clock signal;
   a second input terminal configured to receive a second clock signal;
   a plurality of first control terminals configured to receive first control signals, respectively;
   a plurality of second control terminals configured to receive second control signals, respectively;
   an output terminal;
   a plurality of first inverters each including an input node coupled to the first input terminal, a control node coupled to a corresponding one of the first control terminals and an output node coupled to the output terminal, each of the first inverters being configured to be controlled to output an inverted first clock signal to the output terminal in response to a corresponding one of the first control signals supplied to a corresponding one of the control nodes;
   a plurality of second inverters each including an input node coupled to the second input terminal, a control node coupled to a corresponding one of the first control terminals and an output node coupled to the output terminal, each of the second inverters being configured to be controlled to output an inverted second clock signal to the output terminal in response to a corresponding one of the second control signals supplied to a corresponding one of the control nodes;
   an additional first inverter including an input node coupled to the first input terminal and an output node coupled to the output terminal, the additional first inverter being free from any other control nodes to output an inverted first clock signal to the output terminal; and
   an additional second inverter including an input node coupled to the second input terminal and an output node coupled to the output terminal, the additional second inverter being free from any other control nodes to output an inverted first clock signal to the output terminal.

2. The semiconductor device as claimed in claim 1, wherein
   each of the first inverters drives the first clock signal to the output terminal in response to a drive capability defined by a corresponding one of the first control signals and the additional first inverter drives the first clock signal to the output terminal by a fixed drive capability.

3. The semiconductor device as claimed in claim 1, further comprising:
   a plurality of third inverters each including an input node coupled to a corresponding one of the first control terminals and an output node coupled to a corresponding one of the second control terminals.

4. The semiconductor device as claimed in claim 3, wherein
   each of the first inverters drives the first clock signal to the output terminal in response to a drive capability defined by a corresponding one of the first control signals and the additional first inverter drives the first clock signal to the output terminal by a fixed drive capability and
   each of the second inverters drives the second clock signal to the output terminal in response to a drive capability defined by a corresponding one of the second control signals and the additional second inverter drives the second clock signal to the output terminal by a fixed drive capability.

5. The semiconductor device as claimed in claim 4, further comprising:
   a third input terminal configured to receive a third clock signal;
   a plurality of delay elements coupled in series between the third input terminal and an internal node; and
   a selection circuit receiving an adjustment code, selecting one of the delay elements in response to the adjustment code, coupling an input node of the one of the delay elements and the first input terminal, coupling an output node of the one of the delay elements and the second input terminal.

6. A semiconductor device comprising:
   first and second input terminals configured to receive first and second clock signals, respectively;
   a plurality of control terminals configured to receive control signals, respectively;
   an output terminal;
   a first output circuit driving the first clock signal to the output terminal in response to a drive capability defined by the control signals;
   a second output circuit driving the second clock signal to the output terminal in response to a drive capability defined by the control signals;
   a third output circuit driving the first clock signal to the output terminal by a fixed drive capability; and
   a fourth output circuit driving the second clock signal to the output terminal by the fixed drive capability.

7. The semiconductor device as claimed in claim 6, further comprising:
   a third input terminal configured to receive a third clock signal;
   a plurality of delay elements coupled in series between the third input terminal and an internal node; and
   a selection circuit receiving an adjustment code, selecting one of the delay elements in response to the adjustment code, coupling an input node of the one of the delay elements and the first input terminal, coupling an output node of the one of the delay elements and the second input terminal.

8. The semiconductor device as claimed in claim 6, wherein each of first to fourth output circuits outputs an output signal which an input signal reversed.

9. The semiconductor device as claimed in claim 8, wherein the first output circuit is a clocked inverter and the second output circuit is a clocked inverter.

10. The semiconductor device as claimed in claim 8, wherein the third output circuit is an inverter and the fourth output circuit is an inverter.

11. The semiconductor device as claimed in claim 8, wherein the first output circuit is a clocked inverter, the second output circuit is a clocked inverter, the third output circuit is an inverter and the fourth output circuit is an inverter.

12. A semiconductor device comprising:
   first and second input terminals;
   a plurality of first control terminals;
   a plurality of second control terminals;
   an output terminal;
   a plurality of first clocked inverters each including a first input node coupled to the first input terminal, a first control node coupled to a corresponding one of the first control terminals and a first output node coupled to the output terminal;
   a plurality of second clocked inverters each including a second input node coupled to the second input terminal, a second control node coupled to a corresponding one of the second control terminals and a second output node coupled to the output terminal;
   a first inverter including a third input node coupled to the first input terminal and a third output node coupled to the output terminal, control nodes being not prepared in the first inverter;
   a second inverter including a fourth input node coupled to the second input terminal and a fourth output node coupled to the output terminal, control nodes being not prepared in the second inverter; and
   a plurality of third inverters each including a fifth input node coupled to a corresponding one of the first control terminals and a fifth output node coupled to a corresponding one of the second control terminals.

13. The semiconductor device as claimed in claim 12, further comprising:
   a third input terminal;
   a plurality of delay elements coupled in series between the third input terminal and a internal node; and
   a selection circuit receiving an adjustment code, selecting one of the delay elements in response to the adjustment code, coupling an input node of the one of the delay elements and the first input terminal, coupling an output node of the one of the delay elements and the second input terminal.

14. The semiconductor device as claimed in claim 12, wherein the first inverter is smaller than each of the first clocked inverters in transistor size and the second inverter is smaller than each of the second clocked inverters in transistor size.

15. The semiconductor device as claimed in claim 12, wherein the first and second inverters are equal in transistor size to each other.

16. The semiconductor device as claimed in claim 12, wherein the first clocked inverters are different in transistor size from each other and the second clocked inverters are different in transistor size from each other.

* * * * *

UNITED STATES PATENT AND TRADEMARK OFFICE
CERTIFICATE OF CORRECTION

| | | Page 1 of 1 |
|---|---|---|
| PATENT NO. | : 9,053,779 B2 | |
| APPLICATION NO. | : 14/169442 | |
| DATED | : June 9, 2015 | |
| INVENTOR(S) | : Kazutaka Miyano, Ryuji Takishita and Takeshi Konno | |

It is certified that error appears in the above-identified patent and that said Letters Patent is hereby corrected as shown below:

In the Claims

| | Reads | Should Read |
|---|---|---|
| Column 12, Line 2 | "inverted first clock" | --inverted second clock-- |

Signed and Sealed this
Twenty-ninth Day of March, 2016

Michelle K. Lee
*Director of the United States Patent and Trademark Office*